(12) United States Patent
Schwartz

(10) Patent No.: US 6,544,052 B1
(45) Date of Patent: Apr. 8, 2003

(54) BRACKET FOR GUIDING AN ELECTRONIC MODULE DURING EXTRACTION FROM A SHELVING SYSTEM

(75) Inventor: Steven D. Schwartz, Phoenix, AZ (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 10/084,027

(22) Filed: Feb. 27, 2002

(51) Int. Cl.$^7$ ............................................. H01R 13/62
(52) U.S. Cl. ..................... 439/152; 439/377; 361/798; 361/801; 361/802
(58) Field of Search .............................. 439/152, 377, 439/325, 374; 361/798, 802, 730, 732, 741, 756, 801

(56) References Cited

U.S. PATENT DOCUMENTS 4,699,594 A * 10/1987 Assel et al. ................. 439/152
RE33,283 E * 7/1990 Hollingsead et al. ........ 439/296
5,317,480 A * 5/1994 Chandraiah et al. ........ 361/785

* cited by examiner

Primary Examiner—P. Austin Bradley
Assistant Examiner—Ross Gushi

(57) ABSTRACT

An equipment rack includes a shelf and a backplane which supports and receives an electronic module having a rear connector. The backplane includes a complementary connector for engaging the rear connector along an insertion axis. An extraction tool is coupled to the shelf and to the module for disengaging the rear connector from the complementary connector while producing an extraction force having a first component substantially along the insertion axis and a second component substantially perpendicular to the insertion axis. A hold-down bracket is coupled to the module and slidably engages the shelf to counteract the second component of the extraction force until the rear connector disengages from the complementary connector and thus avoids upward movement of the module.

18 Claims, 7 Drawing Sheets

100

BRACKET FOR GUIDING AN ELECTRONIC MODULE DURING EXTRACTION FROM A SHELVING SYSTEM

TECHNICAL FIELD

This invention relates generally to the mounting of electronic equipment, and more particularly to an apparatus for facilitating the extraction of modules from a shelving system.

BACKGROUND OF INVENTION

Amongst the generalized inner-workings of multifaceted apparatus, electronic equipment can be said to have significant value. The architecture of such equipment often entails significant production cost, and electronic equipment often performs vital processing functions producing direct or indirect results in response to data input or operator commands. Thus, any damage done to electronic equipment may be relatively costly, and any malfunction in electronic equipment may lead to incorrect results or greater mechanical and/or electrical failures. The architecture of electronic equipment is usually inherently delicate. Thus, protecting such equipment is important for several reasons. In particular, it is desirable that a housing apparatus, cabinet, or shelving system for receiving and retaining electronic modules: (1) protect the electronic equipment and (2) provide precise alignment of the electronic interfaces (e.g. male and female connectors). Under certain conditions, these basic criteria may be more difficult to meet. Electronic equipment undergoing transport, for instance, experiences an increased risk of damage due to constant subjection to vibrations and other aberrant forces. This is also true for electronic systems of the type employed in aircraft since such electronic systems frequently experience forces that threaten to dislodge and damage them.

To provide better protection of electronic equipment and maintain proper couplings between interfaces, hold-down mechanisms have been introduced. Early hold-down mechanisms secured electronic units onto a rack through the application of a constant pressure. Such hold-down mechanisms effectively protected electronic units from damage and consequently became commonly employed in aircraft electronic shelving systems. However, the design of these hold-down mechanism suffered from several shortcomings. For example, such mechanisms increased the weight of the electronic units. Additionally, early hold-down mechanisms were capable of generating forces greater than necessary potentially damaging the equipment. Several other limitations were also inherent in the architecture of these hold-down mechanisms such as the lack of means to prevent loosening of set-screws and the like during flight.

A more desirable hold-down apparatus is shown and described in U.S. Pat. No. 3,640,141 issued to Hollinsead et al. on Feb. 8, 1972, the teachings of which are herby incorporated by reference. This device, referred to as an extractor hold-down apparatus, is improved over the previous hold-down device in several ways, For example, a singular extractor hold-down apparatus provides sufficient force to suitably secure an electronic unit in place thus reducing the undesirable accumulation of weight. Furthermore, unlike the initial hold-down mechanisms, this extractor hold-down apparatus does not generate excessive forces and provides a convenient way to gauge the applied force. The device is capable of generating a forward driving force for inserting an electronic module to provide proper connection between the module and backplane connectors and an extraction force for dislodging the module from its connections and extracting it (e.g. an extraction force of 100 pounds would not be uncommon). This extractor hold-down device became commonly used in the field of avionics and is now required by the Air Transport Avionics Equipment Interface, ARINC Specifications 600.

Unfortunately, an undesirable upward-directed force is produced by the above described hold-down apparatus during extraction. That is, due to its design, the spindle or axis of the device forms an angle with the plane of the engaging male and female connecters which may be as high as 9 to 25 degrees. Thus, the extraction force is not limited to a desired axis but includes a component which acts perpendicularly to the axis of the connector pins of the male/female connector interface (hereinafter referred to as the axis of the connector interface). In the case of heavier electronic units, this aberrant force is compensated for by the mass of the unit and is not a significant issue. However, lighter electronic units are increasingly being developed and introduced. Unfortunately, the perpendicular force generated by the hold-down extractor apparatus on such lighter units becomes problematic. Specifically, the extraction force generated perpendicular to the desired axis of the connector interface is sufficient to bend the connector pins damaging the module and may perhaps cause the module to wedge preventing further removal. It should also be noted that undesirable forces of this nature may be exacerbated via other sources; for example, by lifting upwards on a handle of a module being removed instead of extracting the module along the line of the connector interface axis.

In view of the foregoing, it should be appreciated that it would be desirable to provide a lightweight, module-extracting apparatus which avoids the generation of forces perpendicular to the axis of the electronic interface. Such a device would be especially suited for use in an avionics shelving apparatus. Additional desirable features will become apparent to one skilled in the art from the foregoing background of the invention and following detailed description of a preferred exemplary embodiment and appended claims.

SUMMARY OF THE INVENTION

According with a first aspect of the invention, there is provided an equipment rack including a shelf and a backplane which supports and receives an electronic module having a rear connector. The backplane includes a complementary connector for engaging the rear connector along an insertion axis. An extraction tool is coupled to the shelf and to the module for disengaging the rear connector from the complementary connector while producing an extraction force having a first component substantially along the insertion axis and a second component substantially perpendicular to the insertion axis. A hold-down bracket is coupled to the module and slidably engages the shelf to counteract the second component of the extraction force until the rear connector disengages from the complementary connector.

In accordance with a further aspect of the invention, there is provided an electronic module capable of being supported on a shelf and comprising a housing having at least a front surface, a rear surface, and a bottom surface, the bottom surface for slidably engaging the shelf. The module includes at least a first connector in the rear surface thereof, and a hold-down bracket is fixedly coupled to the bottom surface and cooperates therewith to form a channel capable of slidably engaging at least a portion of the shelf.

According to a still further aspect of the invention, there is provided a hold-down bracket for forming a receiving channel with an undersurface of an electronic module which slidably engages a portion of a shelf. The bracket comprises a cross member having an upper surface and a lower surface, the lower surface for fixedly engaging the undersurface of the module. At least one longitudinal member extends from the cross member and is spaced from the undersurface to form the receiving channel.

BRIEF DESCRIPTION OF THE DRAWINGS

The present invention will hereinafter be described in conjunction with the appended drawings, wherein like numerals denote like elements, and.

DESCRIPTION OF THE PREFERRED EMBODIMENT

The following detailed description of a preferred embodiment of the invention is mainly exemplary in nature and not intended to limit the invention or the application or use of the invention.

Figure 1:
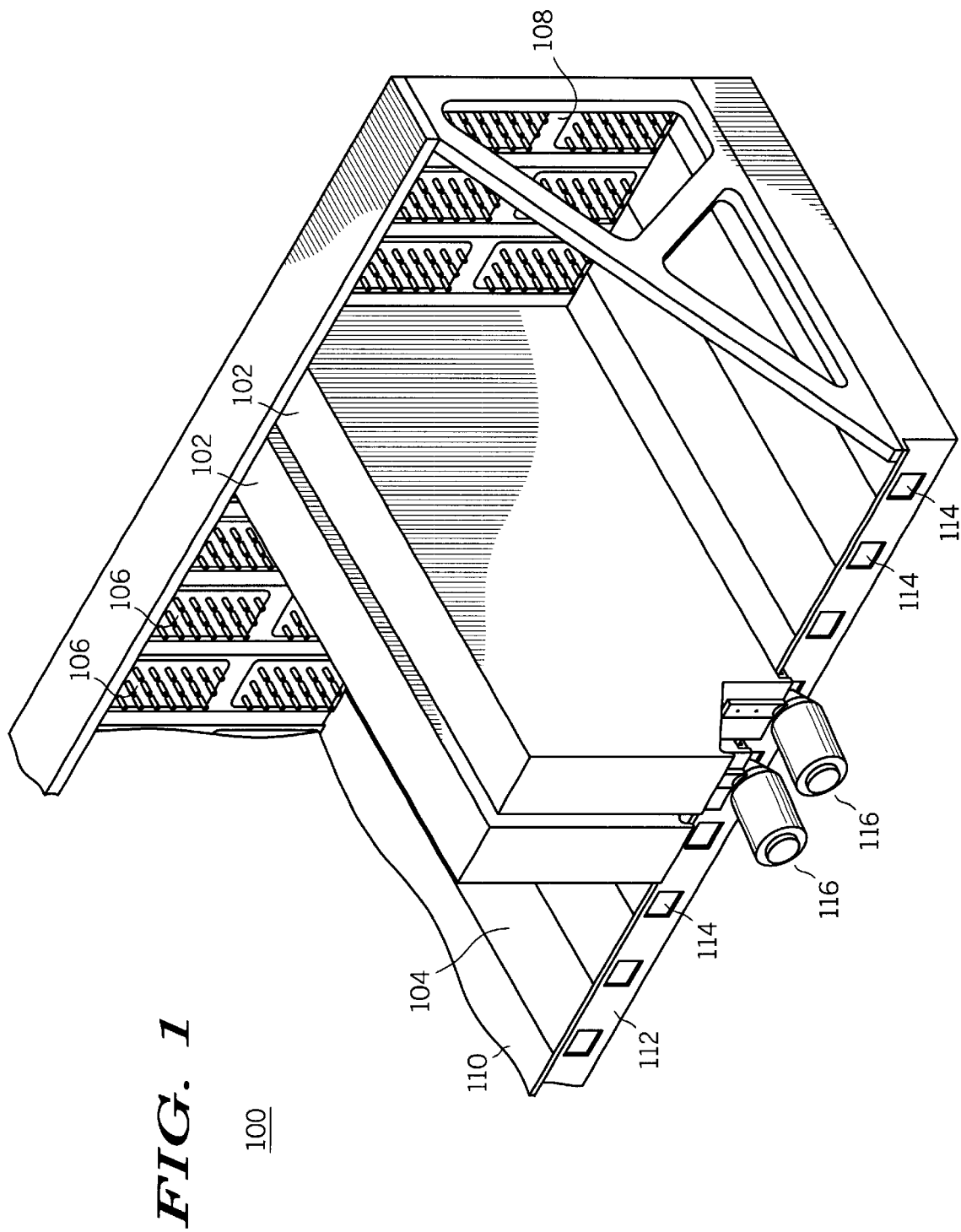
FIG. 1 is an isometric view of a shelf or equipment rack configured to receive a plurality of electronic modules.

FIG. 1 is an isometric view of an equipment shelf or rack 100 configured to receive a plurality of electronic modules 102. Modules 102 slidably engage and are received, for example, in slots 104, and sockets of rear female connectors receive and engage pins of complementary male connectors such as is shown at 106 in backplane 108. The floor 110 of shelf 100 is provided with a downward extending flange 112 having a plurality of openings 114 therein. An extraction tool or mechanism 116 is associated with each module 102 and is configured to engage a module 102, pass through one of openings 114, and secure to a lower or undersurface of floor 110 in a manner to be more fully described hereinbelow.

Figure 2:
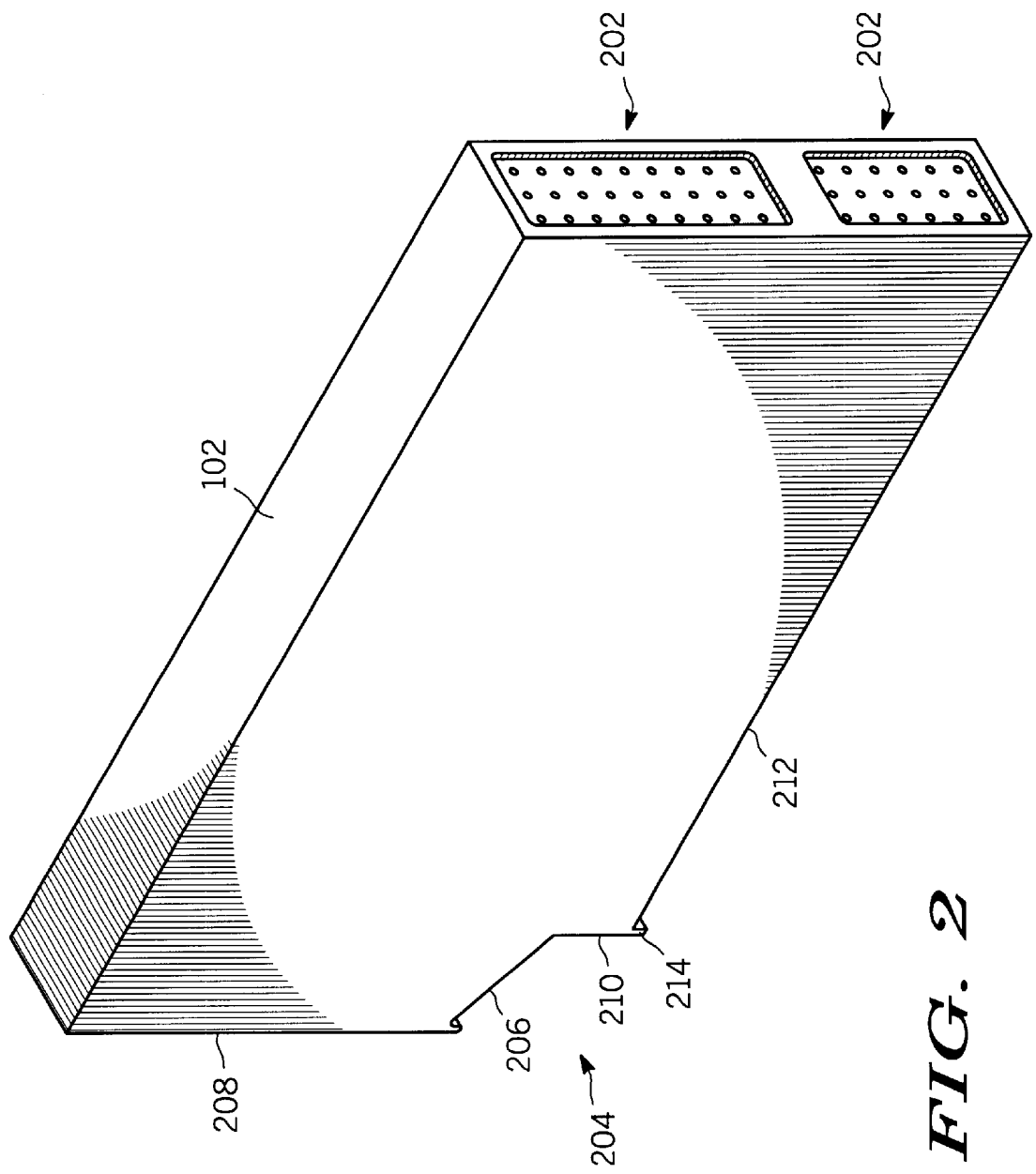
FIG. 2 is an isometric view of a module of the type shown in FIG. 1.

Referring now to FIG. 2, there is shown an isometric view of one of the modules 102 shown in FIG. 1. Each module 102 may contain one or more circuit cards which communicate with other modules or with external circuitry by means of female connectors 202 shown in the rear surface of module 102. The front portion of module 102 is provided with a concavity 204 comprised of a first surface 206 extending downward and inward from the front surface 208 of module 102 and a second surface 210 which extends upward from the bottom surface 212 of module 102 until it reaches surface 206. A bottom portion of surface 210 includes a flange portion 214 which extends beyond and below bottom surface 212 of module 102. This flange 214 is engaged or captured by extraction device 116 to aid in the extraction of module 102 from the shelf assembly 100 as will be more fully described hereinbelow.

Figure 3:
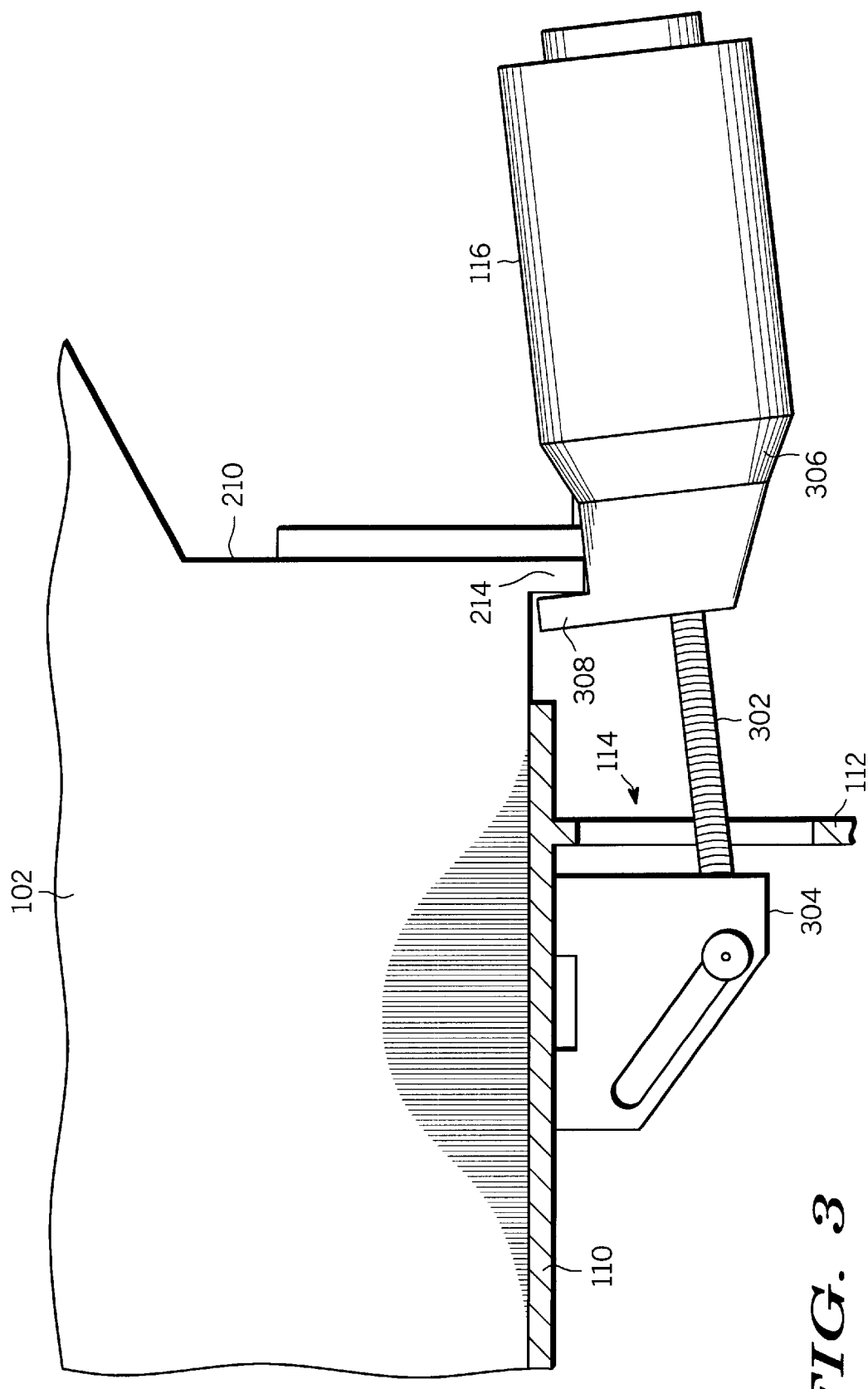
FIG. 3 is a side view of the module depicted in FIG. 2 positioned on the shelf depicted in FIG. 1 and equipped with an extraction tool which cooperates with the shelf and the module.

FIG. 3 is a side view of module 102 positioned on floor 110 of shelf 100. FIG. 3 also illustrates how extraction device 116 cooperates with flange 112, floor 110 of shelf 100, and module 102. As stated previously, extraction device 116 is utilized to extract and secure module 102 on shelf 100. Extraction device 116 includes an externally threaded spindle 302 which extends through aperture 114 (shown in FIG. 1) in downward extending flange 112 and is pivotally coupled to hinge 304 which is, in turn, fixedly coupled to the undersurface of floor 10.

Figure 4:
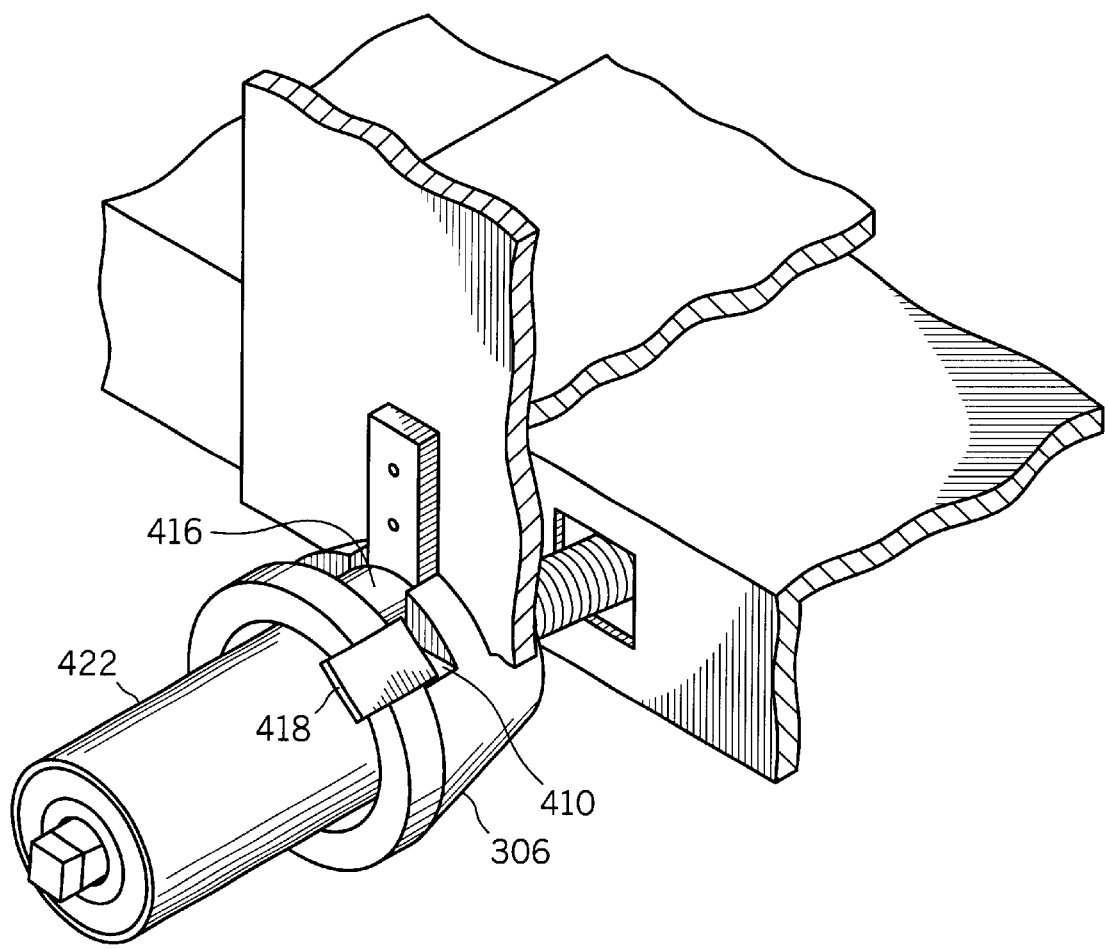
FIG. 4 is an isometric view of the extraction tool shown in FIG. 3.
Figure 5:
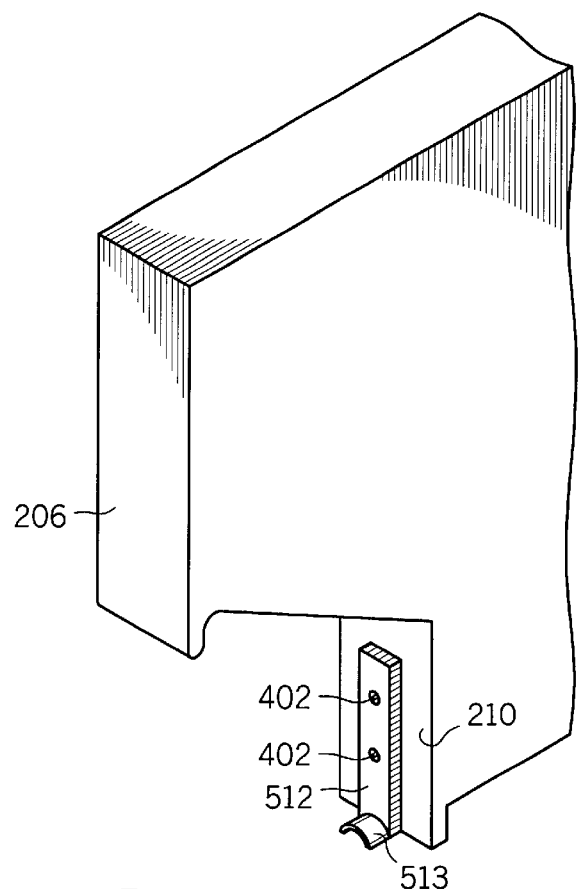
FIG. 5 is a front isometric view of a portion of the module shown in FIG. 2.

Extraction device 116 further includes a carriage 306 which is configured for engagement with module 102. Carriage 306 includes a capture portion 308 which hooks or grabs the flange 214 of module 102. Carriage 306 also includes an axial slot 410 (shown in FIG. 4) which receives a forward extending curved portion 513 of toe 512 which is fixedly coupled to surface 210 as for example by screws 402 shown in FIG. 5. Referring again to FIG. 4, a cup portion 416 is adapted to be pivotally mounted within carriage 306 and includes a handle 418 integrally formed therewith extending outwardly through transverse slot 410. Cup portion 416 and handle 418 may be pivoted across the carriage so as to enable cup 416 to extend over the lower extremity 513 of toe 512 thereby retaining toe 512 and front wall 210 in a secure position.

Carriage 306 is adapted to be driven forward by a drive assembly along the spindle 302 to apply translational force on module 102 rearwardly into engagement with rear connectors 106 and to maintain module 102 in a secure position with a desired amount of force. Carriage 306 is also rearwardly driven to function as an extractor. The drive assembly adapted to drive carriage 306 along spindle 302 is provided with a knob shell 422 which rotates spindle 302. Thus, as knob shell 422 is rotated in a clockwise manner, module 102 is driven inwardly. When knob shell 422 is rotated in a counterclockwise manner, module 102 is extracted. A more detailed description of the structure and operation of extraction device 116 can be found in the above referred to cited U.S. Pat. No. 3,640,141.

As stated previously, the angle formed between the axis of the spindle and the axis of the connector interface (the insertion axis) creates an unwanted force substantially perpendicular to the axis of the male of female connector pins and sockets respectively when module 102 is being extracted through the action of extractor device 116. This unwanted force perpendicular to the insertion axis can damage the connector pins and render extraction of module 102 much more difficult. It has been discovered that this problem can be solved through the use of a hold-down bracket of the type described below.

Figure 6:
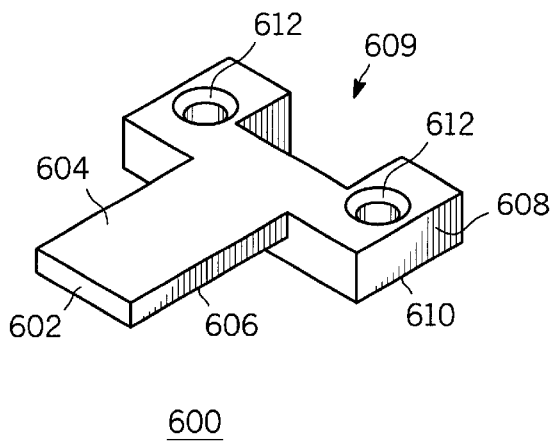
FIG. 6 is an isometric view of hold-down bracket in accordance with the first embodiment of the present invention.
Figure 7:
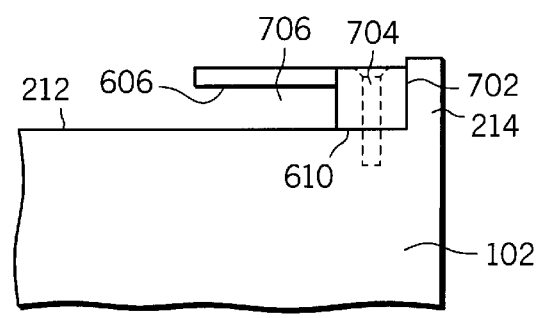
FIG. 7 is side view of a front lower portion of the module depicted in FIG. 2 equipped with one embodiment of a hold-down bracket.

FIG. 6 is an isometric view of hold-down bracket 600 in accordance with a first embodiment of the present invention. As can be seen, it includes a longitudinal plate 602 having a generally flat upper surface 604 and, for the major portion thereof, a generally flat lower surface 606. The plate includes a thicker portion 608 which likewise has a flat lower surface 610. Openings 612 are provided through the thicker portion of the plate for receiving attachment mechanisms such as screws for securing to the lower surface 212 of module 102. Portion 608 has a cutaway 609 for receiving capture portion 308. The resulting structure is shown in FIG. 7, which is side view of a front lower portion of module 102 with hold-down bracket 600 affixed thereto. As can be seen, flat surface 610 of hold-down bracket 600 engages surface 212 of module 102 and is in abutment with a rear portion 702 of lip 214. The hold-down bracket is secured to module 102 by means of screws 704. In this manner, a slot or channel 706 is created between surface 606 and 212 for receiving floor 110 of shelf 100.

Figure 8:
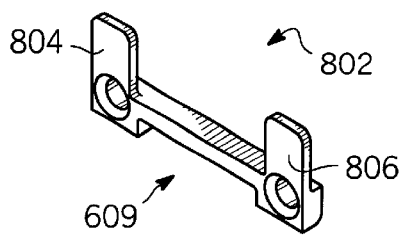
FIG. 8 is an isometric of a hold-down bracket in accordance with a second embodiment of the invention.

FIG. 8 is an isometric view of a hold-down bracket in accordance with a second embodiment of the invention. In this case, a central portion of plate 602 has been removed leaving legs 804 and 806. Module 102 is secured in position by a receiving channel formed between the bottom surface of module 102 and legs 804 and 806 of what now may described as a U-shaped hold-down bracket. As was the case previously, this channel receives a front portion of shelf 110. The space between longitudinal legs 804 and 806 reduces the weight of the hold-down bracket. As was the case previously, cutaway 609 enables capture unit 308 to engage lip 214.

Figure 9:
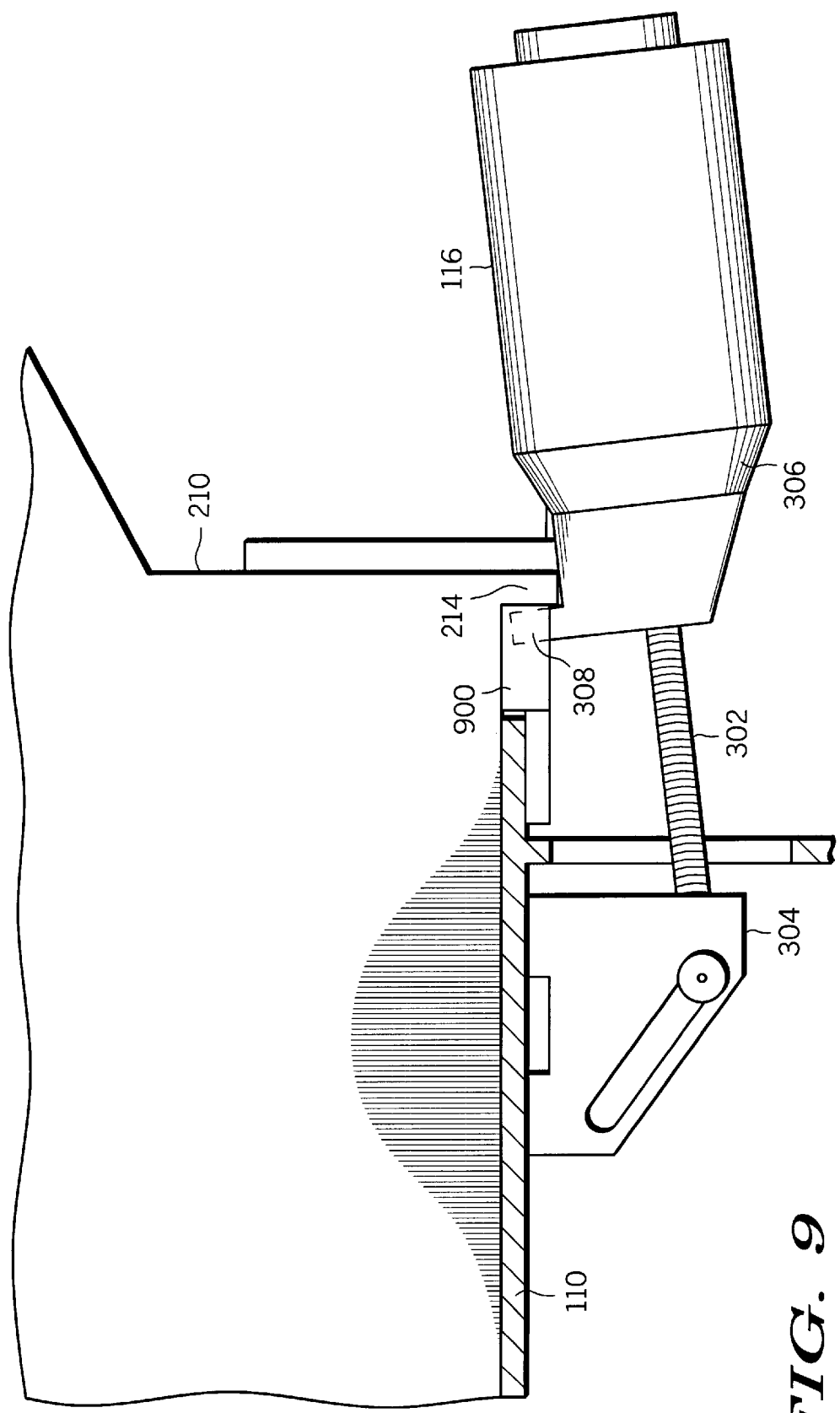
FIG. 9 is a side view of the module depicted in FIG. 2 positioned on a shelf and further equipped with the hold-down bracket shown in FIG. 8.

FIG. 9 is similar to FIG. 3 except that module 102 is now equipped with the hold-down bracket 900 shown in FIG. 6. As can be seen, module 102 is in a fully inserted position such that channel 706 has fully received a front portion of floor 110. As module 102 is extracted by means of extraction device 116 as previously described, both a horizontal and vertical extraction force is imparted to the front portion of module 102. However, since the front portion of shelf 110 is slidably secured within channel 706, module 102 is prevented from moving upward. The length of channel 706 (i.e. the depth to which the front portion of floor 110 is received in channel 706) is preferably equal to or greater than the depth to which pins of connectors 106 are received in female connectors 202. Therefore, when channel 706 clears the front portion of floor 110, the pins of connectors 106 have been fully extracted from female connectors 202. Thus, the vertically upward extraction force produced by extraction device 116 as it is operated to extract module 102 is counteracted by a downward vertical force produced by hold-down bracket 600 and exerted upon the front portion of floor 110.

Figure 10:
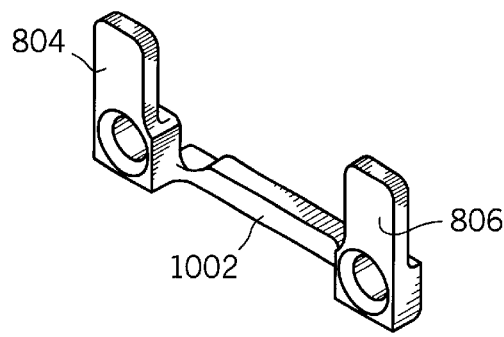
FIGS. 10 and 11 are isometric and front views respectively of a third embodiment of a hold-down bracket.
Figure 11:
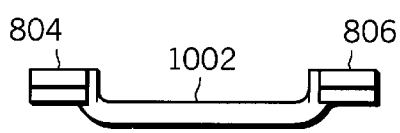
Figure 12:
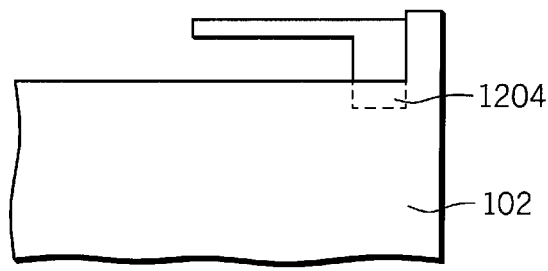
FIG. 12 is a side view of the hold-down bracket shown in FIGS. 10 and 11 fixed to an underportion of the module shown in FIG. 2.

FIGS. 10 and 11 are isometric and front views of a third embodiment of a hold-down bracket, and FIG. 12 is a side view illustrating how the hold-down bracket shown in FIGS. 10 and 11 cooperate with module 102. The hold-down bracket shown in FIGS. 10 and 11 is similar to that shown in FIG. 8 except that the base or cross-member 1002 of the U-shaped bracket is offset from the plane of leg members 804 and 806 such that the upper surface of cross member 1002 resides below the upper surfaces of leg members 804 and 806. The lower surface of cross member 1002 lies below the lower surfaces of cross members 804 and 806 as is shown in FIG. 11. This hold-down bracket is mounted similarly to the hold-down bracket shown in FIG. 7 except that cross member 1002 will now seat in a groove 1204 in the bottom surface 212 of module 102. This provides for both greater clearance and increased bracket stability.

Thus, there has been provided a mechanism for preventing the connectors which couple electronic modules to the backplane of a rack or shelf from being damaged when the modules are extracted. This is accomplished by providing a hold-down bracket which counteracts any vertical force of extraction exerted on the module which would tend to shift the direction of extraction upward and away from the insertion axis of connection.

While preferred exemplary embodiments have been presented in the foregoing detailed description, it should be appreciated that a vast number of variations in the embodiment exist. It should also be appreciated that the preferred embodiments are only examples and not intended to limit the scope, applicability, or configuration of the invention in any way. Rather, the foregoing detailed description provides those skilled in the art with a convenient roadmap for implementing the preferred exemplary embodiments of the invention. Various changes may be made in the function and arrangement described in connection with the exemplary preferred embodiments without departing from the spirit and scope of the invention as set forth in the appended claims.

What is claimed is:

1. An equipment rack, comprising:
   an electronic module having a rear connector and having an undersurface;
   a shelf for receiving and supporting said electronic module;
   a backplane having a complementary connector for matingly engaging said rear connector along an insertion axis;
   an extraction tool coupled to said shelf and to said module for disengaging said rear connector from said complementary connector, said extraction tool producing an extraction force having a first component substantially along said insertion axis and a second component substantially perpendicular to said insertion axis; and
   a hold-down bracket coupled to said module and slidably engaging said shelf to counteract said second component until said rear connector disengages from said complementary connector, said hold-down bracket comprising:
      a cross-member having an upper surface and a lower surface, said lower surface for fixedly engaging said undersurface; and
      at least one longitudinal member extending from said cross-member, said longitudinal capable of being spaced from said undersurface to form a receiving channel when said cross-member fixedly engages said undersurface.

2. An equipment rack according to claim 1 wherein said channel slidably receives at least a portion of said shelf.

3. An equipment rack according to claim 2 wherein one of said rear connector and said complementary connector is a male connector comprised of a plurality of pins and the other of said rear connector and said complementary connector is a female connector comprised of a plurality of sockets for receiving said plurality of pins.

4. An equipment rack according to claim 3 wherein said module comprises a housing having at least a front surface, a rear surface, and a bottom surface extending from said front surface to said rear surface, said bottom surface capable of slidingly engaging said shelf.

5. An equipment rack according to claim 4 wherein said rear connector is in said rear surface.

6. An equipment rack according to claim 5 wherein said hold-down bracket is fixedly coupled to said bottom surface and cooperates therewith to form a channel which slidably engages at least a portion of said shelf.

7. An equipment rack according to claim 6 wherein the depth of said channel is at least as large as the depth to which said pins are received by said sockets.

8. An equipment rack according to claim 7 wherein said at least one longitudinal member has an upper surface coplanar with the upper surface of said cross-member.

9. An equipment rack according to claim 8 wherein said at least one longitudinal member comprises first and second leg members extending from said cross-member to form a substantially U-shaped bracket.

10. An equipment rack according to claim 7 wherein said at least one longitudinal member comprises first and second leg members extending from said cross-member to form a substantially U-shaped bracket and wherein the plane of said cross-member is displaced from the plane of said first and second longitudinal members.

11. An electronic module capable of being supported on a shelf, said module comprising:
- a housing having at least a front surface, a rear surface, and a bottom surface extending from said front surface to said rear surface, said bottom surface capable of slidingly engaging said shelf;
- at least a first connector in said rear surface; and
- a hold-down bracket fixedly coupled to said bottom surface and cooperating therewith to form a channel capable of slidably engaging at least a portion of said shelf, said hold-down bracket comprising:
  - a cross-member having an upper surface and a lower surface, said lower surface for fixedly engaging said bottom surface; and
  - at least one longitudinal member extending from said cross-member, said longitudinal member capable of being spaced from said bottom surface to form a receiving channel when said cross-member fixedly engages said bottom surface.

12. An electronic module according to claim 11 wherein said at least one longitudinal member has an upper surface coplanar with the upper surface of said cross-member.

13. An electronic module according to claim 12 wherein said at least one longitudinal member comprises first and second leg members extending from said cross-member to form a substantially U-shaped bracket.

14. An electronic module according to claim 11 wherein said at least one longitudinal member comprises first and second leg members extending from said cross-member to form a substantially U-shaped bracket and wherein the plane of said cross-member is displaced from the plane of said first and second longitudinal members.

15. A hold-down bracket for forming a receiving channel with an undersurface of an electronic module, said receiving channel for slidably engaging a portion of said shelf, said bracket comprising:
- a cross-member having an upper surface and a lower surface, said lower surface for fixedly engaging said undersurface; and
- at least one longitudinal member extending from said cross-member, said longitudinal member capable of being spaced from said undersurface to form a receiving channel when said cross-member fixedly engages said undersurface.

16. A bracket according to claim 15 wherein said at least one longitudinal member has an upper surface coplanar with the upper surface of said cross-member.

17. A bracket according to claim 16 wherein said at least one longitudinal member comprises first and second leg members extending from said cross-member to form a or substantially U-shaped bracket.

18. A bracket according to claim 15 wherein said at least one longitudinal member comprises first and second leg members extending from said cross-members to form a substantially U-shaped bracket and wherein the plane of said cross-member is displaced from the plane of said first and second longitudinal members.

* * * * *